(12) United States Patent
Ouyang

(10) Patent No.: US 7,628,198 B2
(45) Date of Patent: Dec. 8, 2009

(54) COOLING TECHNIQUE USING A HEAT SINK CONTAINING SWIRLING MAGNETO-HYDRODYNAMIC FLUID

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 904 days.

(21) Appl. No.: 11/346,014

(22) Filed: Feb. 2, 2006

(65) Prior Publication Data

US 2007/0139881 A1 Jun. 21, 2007

Related U.S. Application Data

(63) Continuation-in-part of application No. 11/313,392, filed on Dec. 21, 2005, now Pat. No. 7,417,858.

(51) Int. Cl.
*H05K 7/20* (2006.01)
(52) U.S. Cl. .................. 165/80.4; 165/80.3; 361/699; 366/273
(58) Field of Classification Search .......... 165/80.4; 361/699; 366/273; 417/50
See application file for complete search history.

(56) References Cited

U.S. PATENT DOCUMENTS

| | | | |
|---|---|---|---|
| 3,812,404 A * | 5/1974 | Barkan et al. | ............... 363/141 |
| 4,067,237 A | 1/1978 | Arcella | |
| 4,519,447 A * | 5/1985 | Wiech, Jr. | ............... 165/104.33 |
| 5,144,531 A | 9/1992 | Go et al. | |
| 5,339,214 A | 8/1994 | Nelson | |
| 5,355,942 A | 10/1994 | Conte | |
| 5,365,749 A | 11/1994 | Porter | |
| 5,533,567 A * | 7/1996 | Van Putten et al. | ....... 165/109.1 |
| 5,880,524 A | 3/1999 | Xie | |
| 5,978,220 A | 11/1999 | Frey et al. | |
| 6,019,165 A * | 2/2000 | Batchelder | ............... 165/80.3 |
| 6,766,817 B2 | 7/2004 | da Silva et al. | |
| 6,918,404 B2 | 7/2005 | Dias da Silva et al. | |
| 6,942,018 B2 | 9/2005 | Goodson et al. | |
| 7,066,586 B2 | 6/2006 | da Silva et al. | |
| 7,143,648 B2 * | 12/2006 | Pristup | ............... 73/504.08 |
| 7,265,977 B2 * | 9/2007 | Martin et al. | ............... 361/699 |

(Continued)

OTHER PUBLICATIONS

U.S. Office Action issued in U.S. Appl. No. 11/313,392 mailed on Feb. 21, 2008, 14 pages.

*Primary Examiner*—Allen J Flanigan
(74) *Attorney, Agent, or Firm*—Osha • Liang LLP

(57) ABSTRACT

A heat sink has a heat spreader structure containing magneto-hydrodynamic fluid. Also, the heat spreader includes a central metallic cylinder and a metal ring screen surrounding the central metallic cylinder. Electrical and magnetic fields induce the magneto-hydrodynamic fluid to undergo a swirling motion. The swirling motion acts as an MHD pump and provides efficient heat dissipation from a heat source contacting the heat spreader. A heat sink spreader has a central metallic cylinder surrounded by a metallic ring screen, and a magneto-hydrodynamic fluid. A method of cooling the heat sink spreader includes electrically charging the central metallic cylinder and oppositely electrically charging the metallic ring screen to create an electric potential between the central metallic cylinder and the metallic ring screen; creating a magnetic field inside the heat sink spreader; and swirling the magneto-hydrodynamic fluid to cool a heat source, wherein the swirling motion is induced by the electric potential and the magnetic fields.

20 Claims, 14 Drawing Sheets

U.S. PATENT DOCUMENTS

2002/0046825 A1\* 4/2002 Huang et al. ............... 165/80.4
2002/0143225 A1\* 10/2002 Kagitani ..................... 588/204
2004/0234379 A1 11/2004 Miner et al.
2005/0160752 A1 7/2005 Ghoshal et al.
2008/0279698 A1\* 11/2008 Bau ............................ 417/50

\* cited by examiner

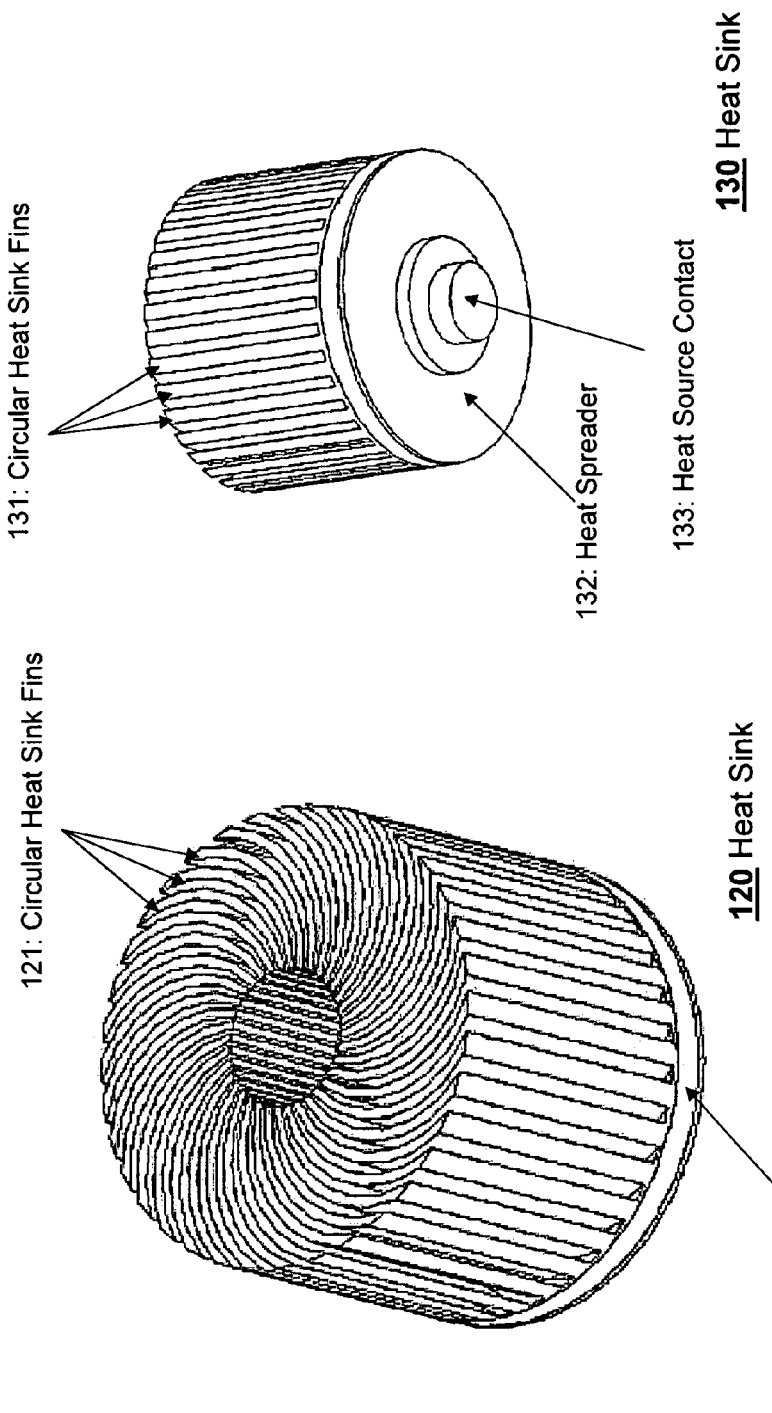

COOLING TECHNIQUE USING A HEAT SINK CONTAINING SWIRLING MAGNETO-HYDRODYNAMIC FLUID

BACKGROUND

A computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media (e.g., a floppy disk or a CD-ROM (not shown)). The computing portion 12, using memory and other internal components, processes both internal data and data provided to the computing portion 12 by the user to generate data requested by the user. The generated data may be provided to the user via, for example, a display device 18 or a printer 20. The computing portion 12 of a computer system typically includes various components such as, for example, a power supply, disk drives, and the electrical circuitry required to perform the necessary and requested operations of the computer system.

As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

In operation, an integrated circuit, such as those shown in FIG. 2, dissipates heat as a result of work performed by the integrated circuit. Energy that is needed by the integrated circuit for work is not consumed with 100% efficiency, thereby resulting in excess energy that is released, among other things, as heat. As integrated circuits become more dense (i.e., more transistors per unit area) and faster (i.e., higher operating frequencies), they generate more heat. As excessive heat is damaging to an integrated circuit both in terms of performance and component integrity, an important design consideration involves ensuring that heat dissipated by an integrated circuit is sufficiently drawn away from the integrated circuit, where the efficiency of drawing away heat from the integrated circuit is expressed in terms of what is referred to as the "heat transfer rate."

"Heat sinks" are devices that are commonly used to cool integrated circuits. FIG. 3 shows a heat sink 50 as used with an integrated circuit 52 housed in a package 54 atop a substrate 56. The heat sink 50 is made of a high thermal conductivity metal (e.g., copper or aluminum). A "high thermal conductivity metal" is one that allows heat to pass through it because it contains many free electrons.

A base of the heat sink 50 is secured over the integrated circuit 52 by, for example, a retention clip (not shown) or an adhesive or thermal interface material (shown, but not labeled). During operation of the integrated circuit 52, the temperature of the integrated circuit 52 increases due to increased particle movement resulting from a build-up of excess energy. The increased integrated circuit temperature results in an increase in the temperature of the package 54, and consequently, of the heat sink 50. The increased temperature of the heat sink 50 results in an increase in the temperature of the air around the heat sink 50, whereby the heated air rises and effectively draws heat away from the integrated circuit 52. This process is referred to as "convection."

The removal of heat dissipated from an integrated circuit by a heat sink is dependent on numerous factors. For example, the thermal resistance of the package that houses the integrated circuit affects how much heat transfers from the integrated circuit to the heat sink. Also, the effectiveness of the adhesives between the integrated circuit and its package and the package and the heat sink affects how much heat transfers between these components. Moreover, the conductivity of the materials used in the package and the heat sink has a direct bearing on the amount of heat that is transferred away from the integrated circuit. The surface area of the heat sink is also important as more surface area results in more air being heated, thereby resulting in more heat being drawn away from the integrated circuit by the rising heated air. Metallic heat sinks with heat spreaders in particular geometrical shapes to maximize the rate of heat dissipation are commonly used. Efficient cooling approaches are critical to the performance and reliability of an IC device with significant power consumption.

SUMMARY

According to one aspect of one or more embodiments of the present invention, an IC package comprises: integrated circuits with one or more heat sources, a heat sink body with circular fins contacting the heat sources; a circular heat spreader at the bottom of the heat sink containing magneto-hydrodynamic (MHD) fluid. In one or more embodiments of the present invention, the heat spreader further comprises a central copper cylinder, copper ring screens surrounding the central copper cylinder, and electrically non-conductive elements attached to the top and the bottom of the central copper cylinder, and magnets attached to the top and the bottom non-conductive elements.

According to another aspect of one or more embodiments of the present invention, a method of cooling a plurality of integrated circuits comprises: generating a plurality of magnetic fields using a top magnet and a bottom magnet which sandwich a circular heat spreader; applying voltage between a copper cylinder and copper ring screens surrounding the copper cylinder to generate radially outward E-field; and creating an inside to outside swirling motion of electrically and thermally conductive fluid inside the circular heat spreader as a result of applying magnetic and electrical fields Other aspects and advantages of the invention will be apparent from the following description and the appended claims.

BRIEF DESCRIPTION OF DRAWINGS

FIG. 12 shows a cylindrical heat sink with circular heat sink fins in accordance with an embodiment of the present invention.

FIG. 13 shows another view of the cylindrical heat sink with circular heat sink fins in accordance with an embodiment of the present invention.

DETAILED DESCRIPTION

Figure 1:
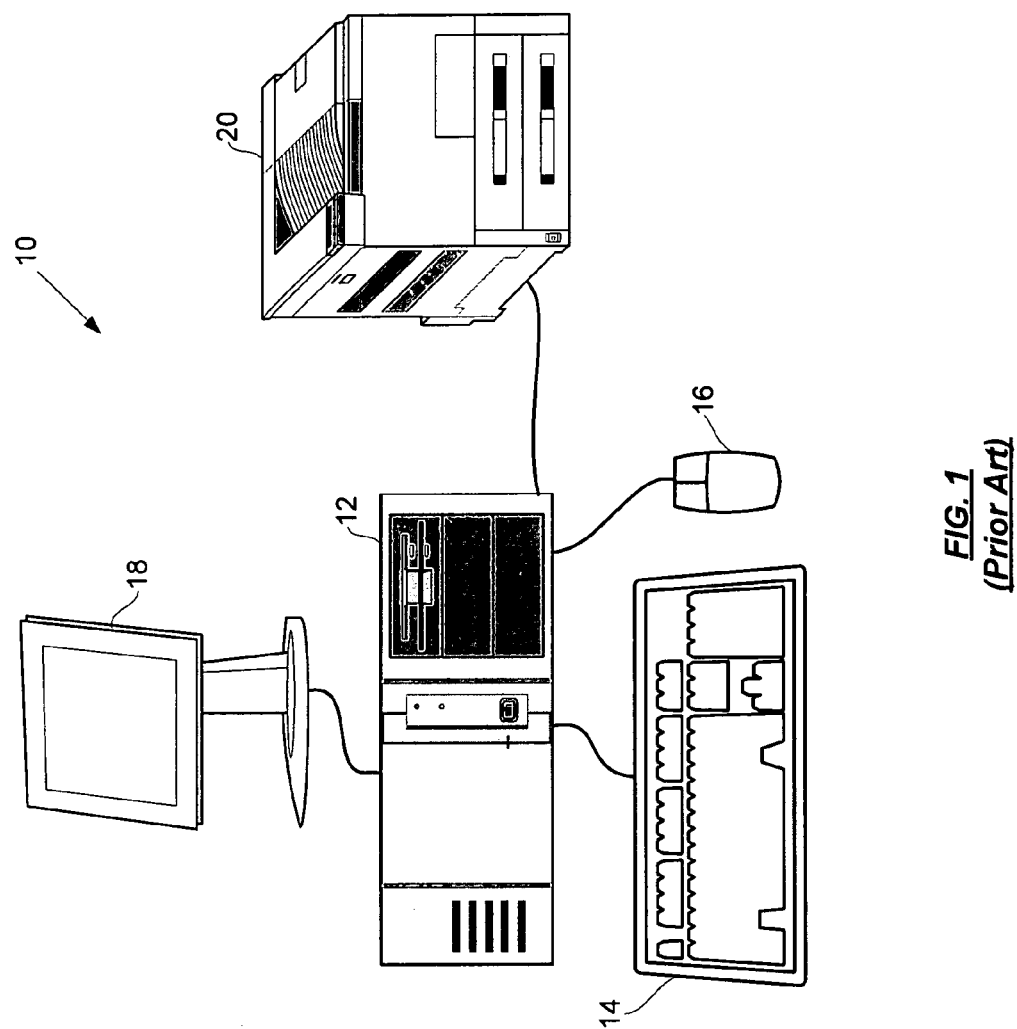
FIG. 1 shows a computer system.
Figure 2:
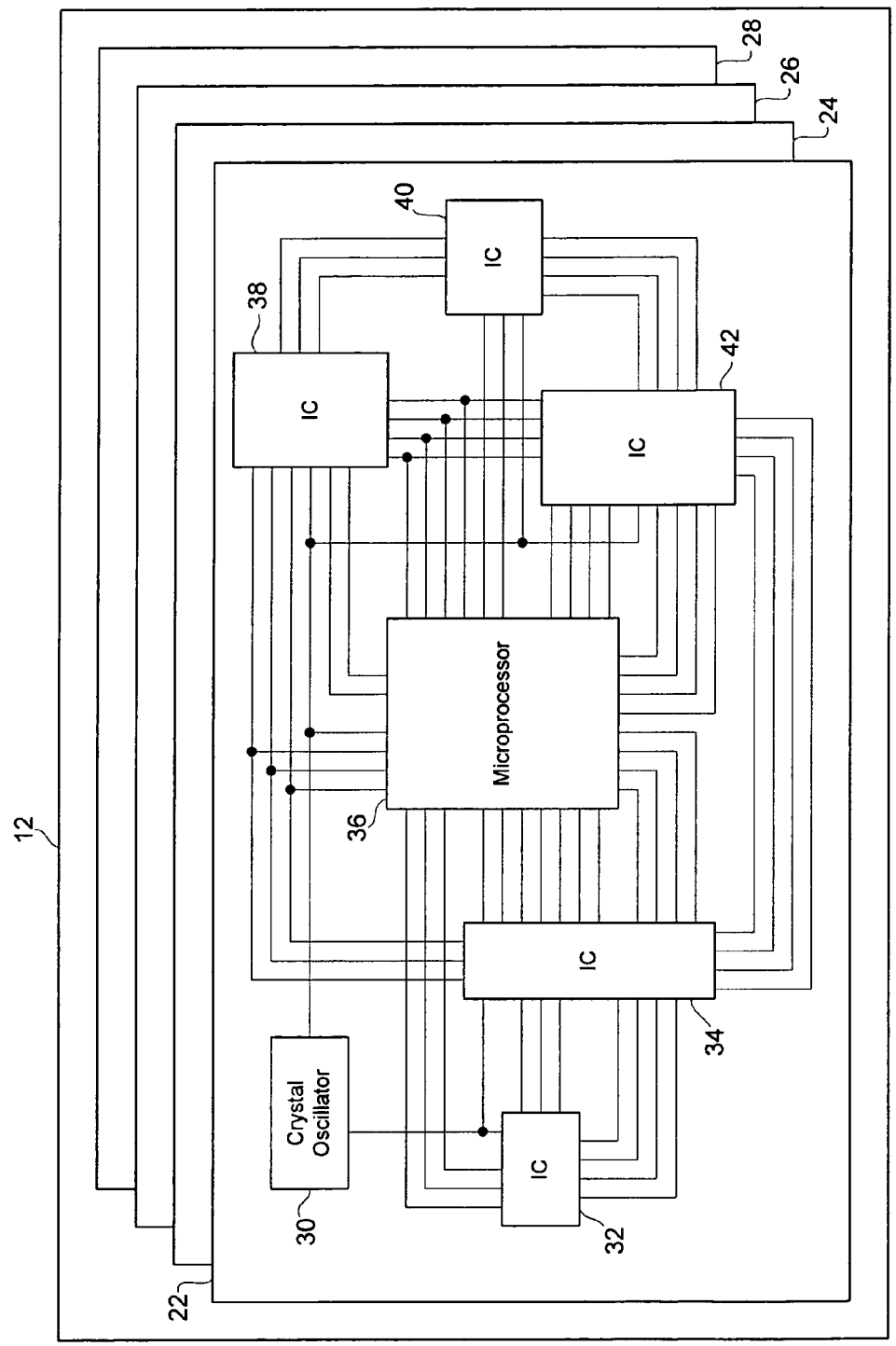
FIG. 2 shows a portion of a computer system.
Figure 3:
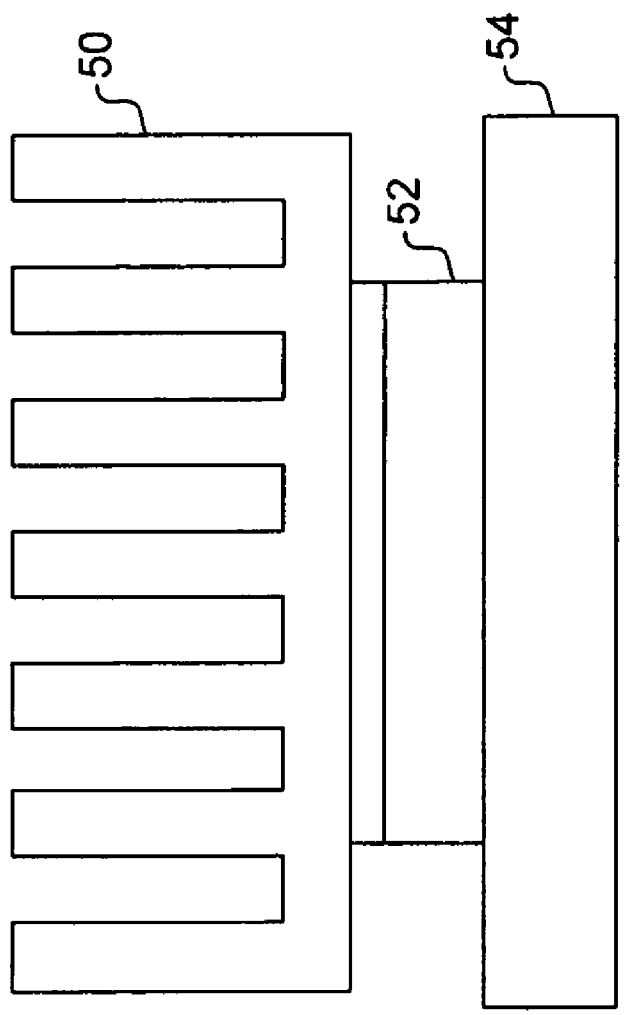
FIG. 3 shows a heat sink as used with an integrated circuit.

As described above with reference to FIG. 3, a typical heat sink is arranged to cool a singly integrated circuit. However, on a circuit board (e.g., circuit board 22 shown in FIG. 2), there are typically multiple integrated circuits. While an individual heat sink could be used for every integrated circuit that is desired to be cooled, in one or more embodiments of the present invention, a cooling apparatus uses a multiple magnet array to control fluid flow for cooling multiple integrated circuits. The multiple magnet array controls fluid flow dependent on magnetic fields generated in the multiple magnet array. Such cooling is referred to herein as "magneto-hydrodynamic" cooling.

Specific embodiments of the invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the invention. In other instances, well-known features have not been described in detail to avoid obscuring the description of embodiments of the present invention.

Figure 4A:
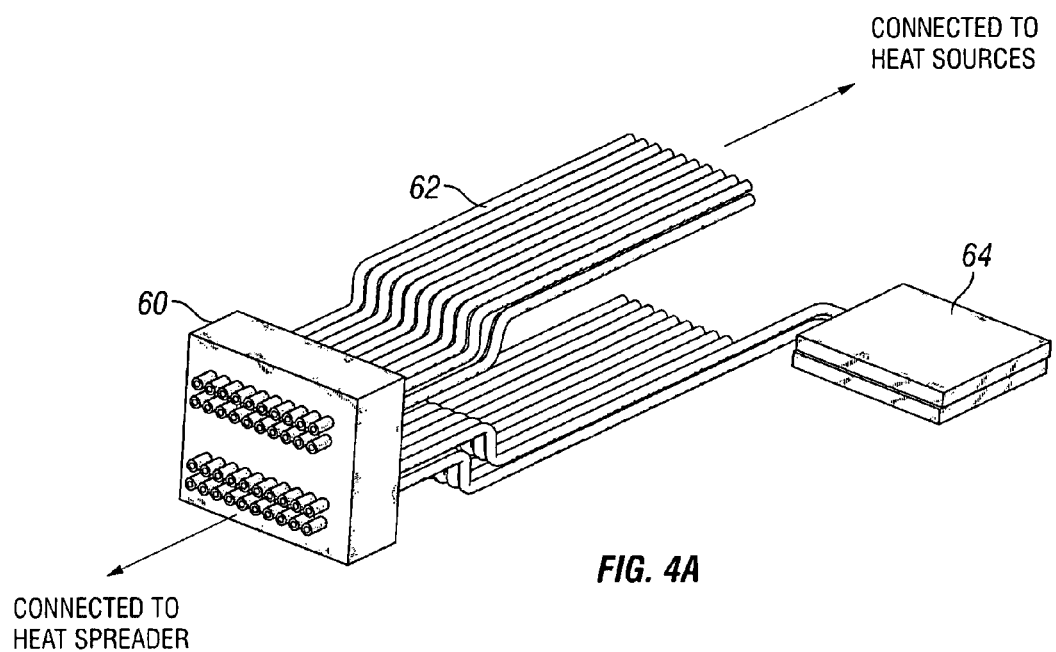
FIG. 4A shows a portion of a heat sink in accordance with an embodiment of the present invention.
Figure 4B:
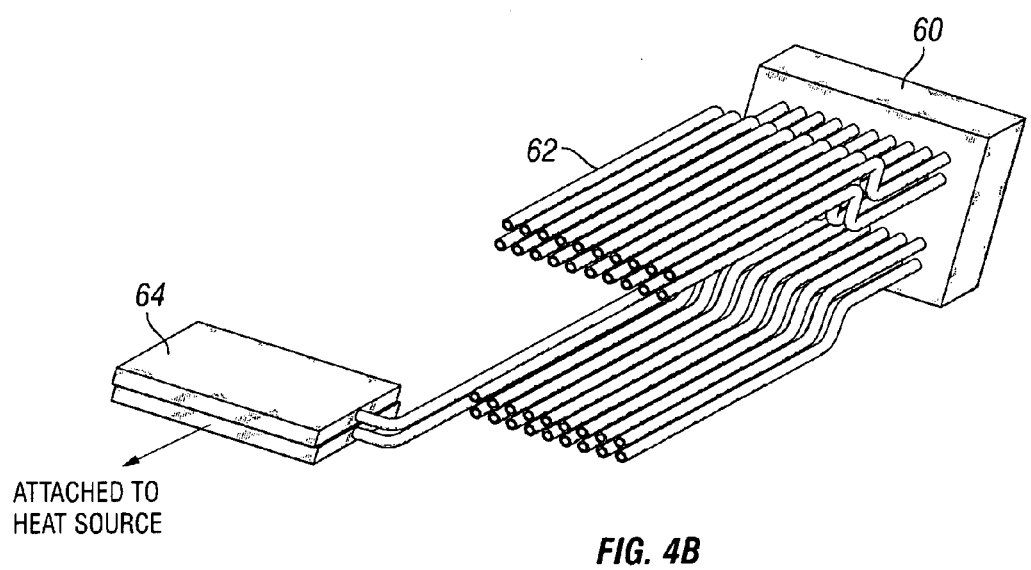
FIG. 4B shows a portion of a cooling apparatus in accordance with an embodiment of the present invention.

FIGS. 4A and 4B show portions of a cooling apparatus in accordance with one or more embodiments of the present invention. In FIG. 4A, a multiple magnet array 60 is operatively connected to several groups (or "levels") of magneto-hydrodynamic pipes 62. The multiple magnet array 60 is arranged to control the flow of fluid in the magneto-hydrodynamic pipes 62 between a heat spreader (or "heat exchanger") (e.g., a copper body having a plurality of fins to dissipate heat) (not shown) and one or more heat sources (e.g., integrated circuits).

Further, as shown in FIGS. 4A and 4B, groups of the magneto-hydrodynamic pipes 62 may be operatively connected to an individual heat sink 64 that is attached to a heat source desired to be cooled. The individual heat sink 64 may be arranged to at least temporarily pool fluid delivered for cooling an attached heat source. Accordingly, those skilled in the art will note that the individual heat sink 64 may have a cavity for pooling fluid. In such a manner, differing volumes of fluid may be delivered to the individual heat sink 64 for cooling of the attached heat source.

Figure 5:
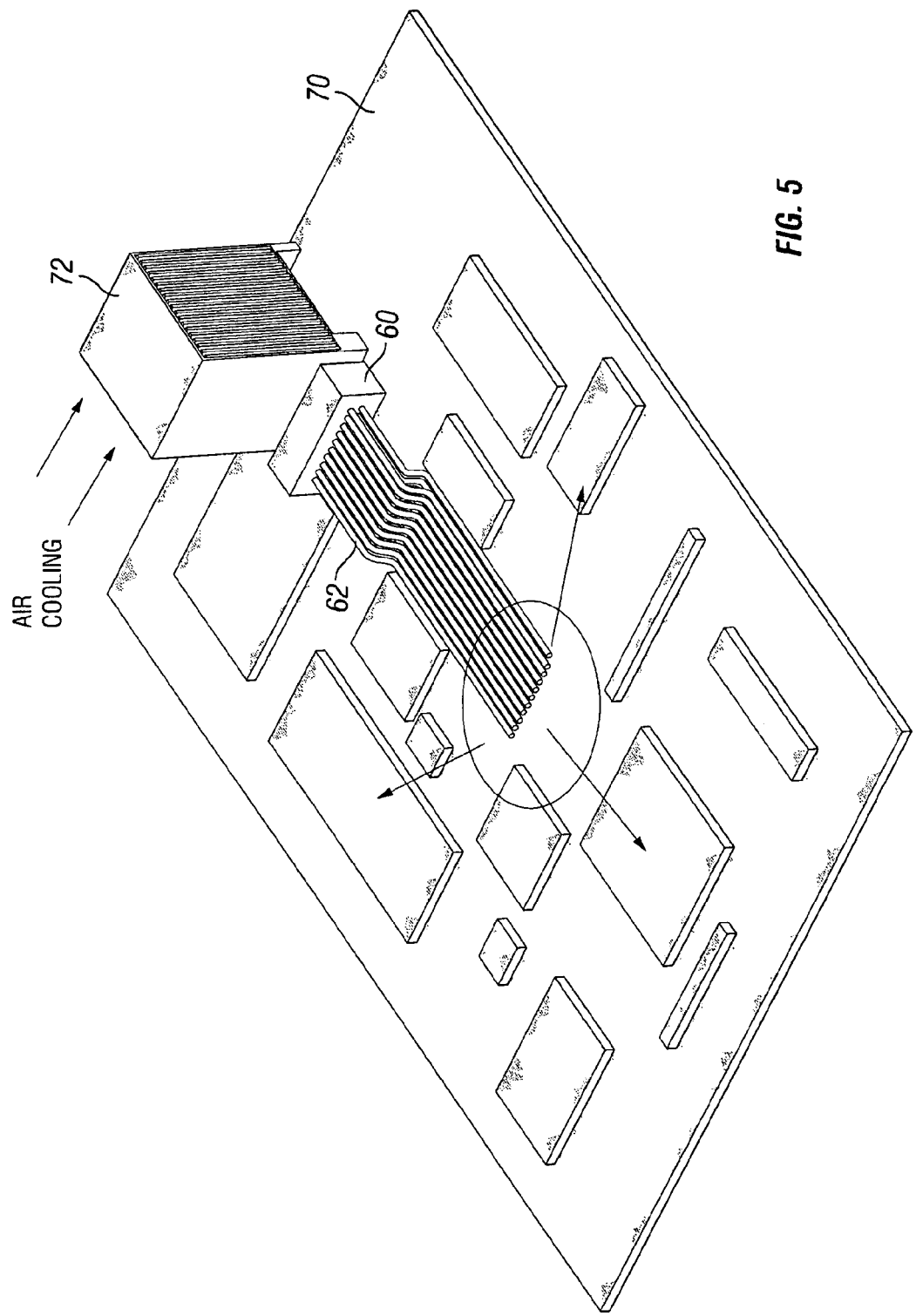
FIG. 5 shows a cooling apparatus in accordance with an embodiment of the present invention.

FIG. 5 shows an example of a cooling apparatus in accordance with an embodiment of the present invention. Particularly, FIG. 5 shows a cooling apparatus as it is implemented on a circuit board 70. The multiple magnet array 60 is operatively connected to the magneto-hydrodynamic pipes 62. The multiple magnet array 60 is also operatively connected to or attached to a heat sink cooling fins 72. The heat sink cooling fins 72 is arranged to dissipate heat as air is passed through the heat sink cooling fins 72 (an example of a direction of air flow through the heat sink cooling fins 72 is indicated by the corresponding arrows shown in FIG. 5).

Fluid carried by the magneto-hydrodynamic pipes 62 may be directed to one or more integrated circuits (shown, but not labeled) disposed on the circuit board 70. Further, certain groups of the magneto-hydrodynamic pipes 62 are arranged to carry heated fluid away from one or more integrated circuits (shown, but not labeled) disposed on the circuit board 70.

Figure 6A:
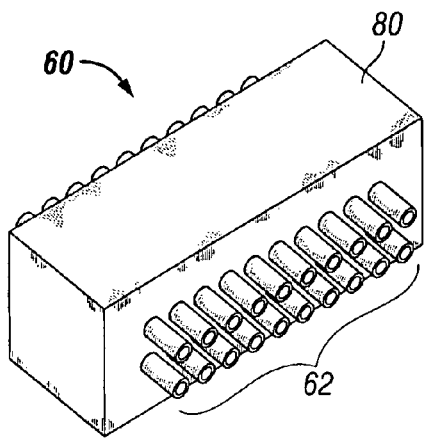
FIG. 6A shows a portion of a cooling apparatus in accordance with an embodiment of the present invention.

FIG. 6A shows a portion of a cooling apparatus in accordance with an embodiment of the present invention. Particularly, FIG. 6A shows an example of the multiple magnet array 60. The multiple magnet array 60, as described above, is arranged to generate a plurality of magnetic fields. Accordingly, the multiple magnet array 60 may be housed in a ferromagnetic metal piece 80 arranged to at least partially shield the plurality of magnetic fields. Those skilled in the art will note that such shielding may eliminate or at least reduce magnetic interference with other components (e.g., integrated circuits).

Figure 6B:
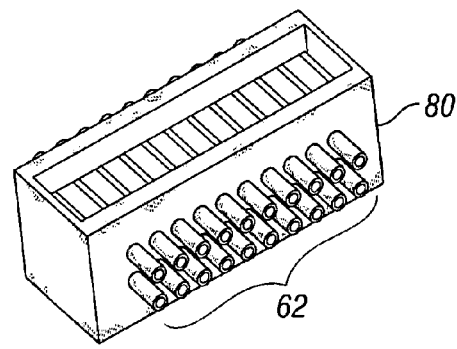
FIG. 6B shows a portion of a cooling apparatus in accordance with an embodiment of the present invention.
Figure 6C:
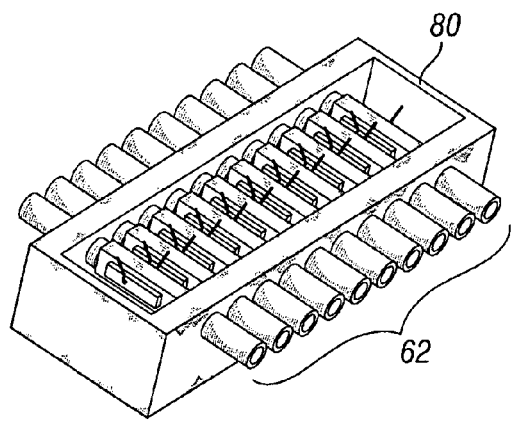
FIG. 6C shows a portion of a cooling apparatus in accordance with an embodiment of the present invention.
Figure 6D:
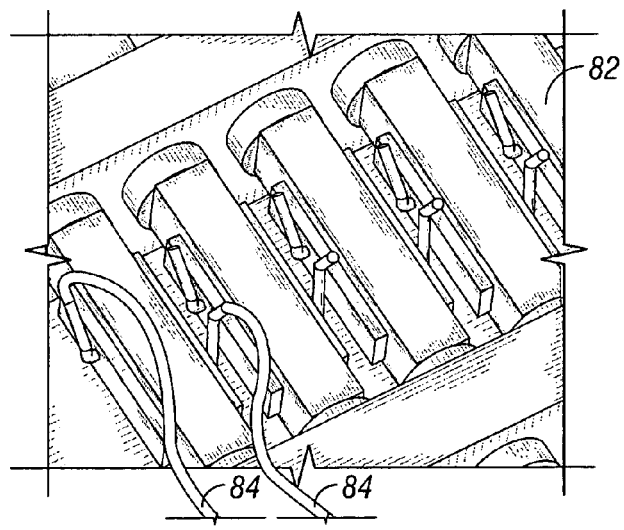
FIG. 6D shows a portion of a cooling apparatus in accordance with an embodiment of the present invention.

FIGS. 6B, 6C, and 6D shows interior portions of the multiple magnet array 60. Within the ferromagnetic metal piece 80, each of the magneto-hydrodynamic pipes 62 has an electrically non-conductive segment 82. For example, in one or more embodiments of the present invention, a segment of a magneto-hydrodynamic pipe 62 within the confines of the ferromagnetic metal piece 80 may be formed of plastic.

Now, as most clearly shown in FIG. 6D, a first electrical conductor (shown, but not labeled) is disposed along a portion of each of the electrically non-conductive segments 82. A second electrical conductor (shown, but not labeled) is disposed along another portion of each of the electrically non-conductive segments 82. Connected to each first electrical conductor (shown, but not labeled) and each second electrical conductor (shown, but not labeled) are wires 84. The wires 84 may be used to carry current to or apply voltage to a connected first or second electrical conductor. In one or more embodiments of the present invention, the first electrical conductors (shown, but not labeled) and the second electrical conductors (shown, but not labeled) may be formed of, for example, copper.

Figure 7:
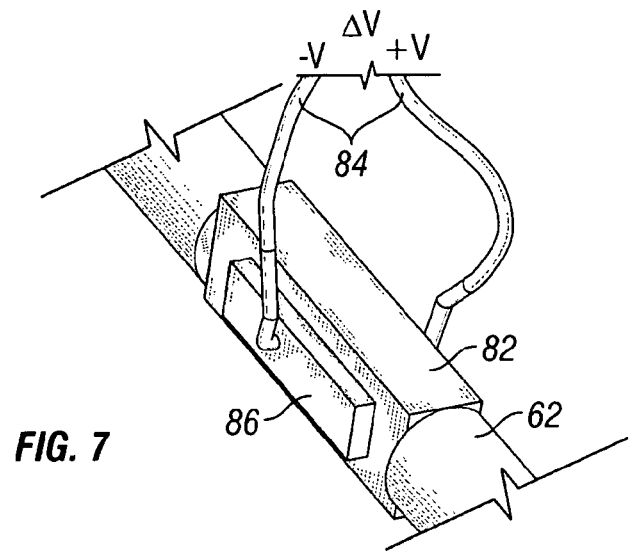
FIG. 7 shows a portion of a cooling apparatus in accordance with an embodiment of the present invention.

For purposes of clarity, FIG. 7 shows an example of an individual magneto-hydrodynamic pipe 62 and electrically non-conductive segment 82 that is housed in a multiple magnet array. In FIG. 7, a first electrical conductor 86 is attached to a portion of the electrically non-conductive segment 82. A second electrical conductor (not shown) is attached to another portion of the electrically non-conductive segment 82.

Figure 8:
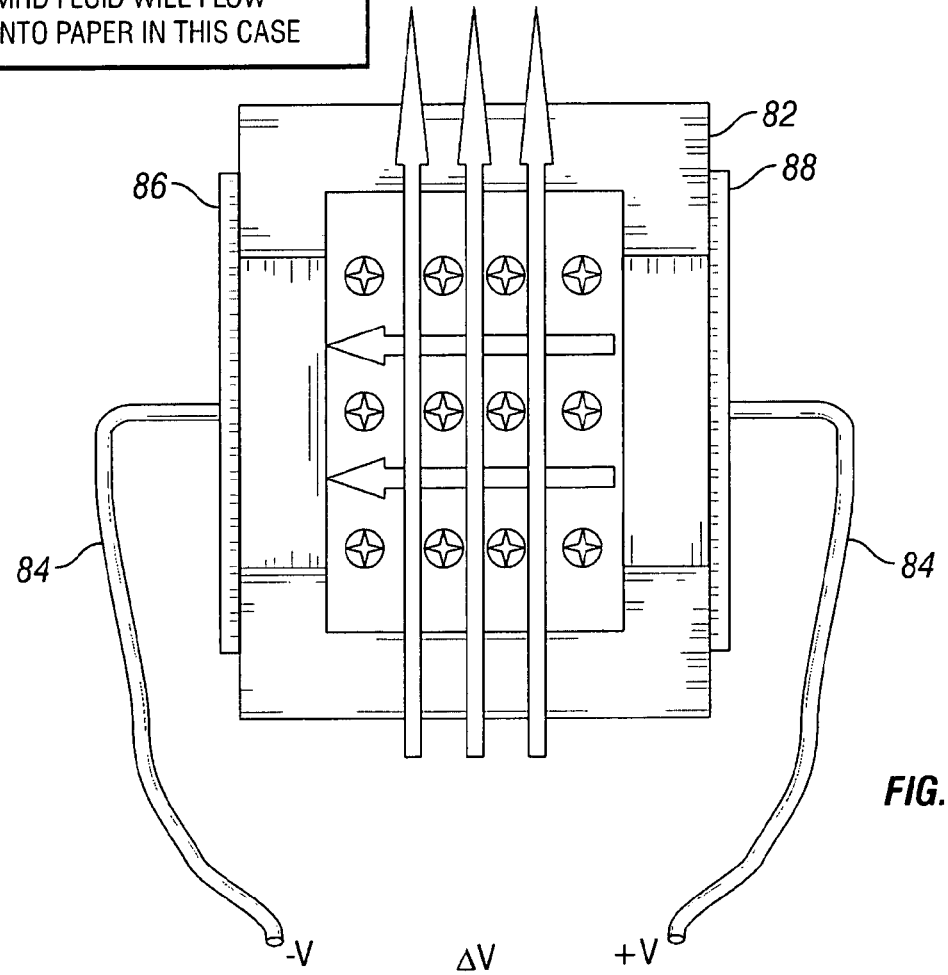
FIG. 8 shows a portion of a cooling apparatus in accordance with an embodiment of the present invention.

Now referring to FIG. 8, the wires 84 connected to each of the first electrical conductor 86 and the second electrical conductor 88 are used to create a voltage potential difference between the first electrical conductor 86 and the second electrical conductor 88. Those skilled in the art will note that such a voltage potential difference may be created by causing one of the first electrical conductor 86 and the second electrical conductor 88 to have a voltage higher than that of the other of the first electrical conductor 86 and the second electrical conductor 88. As shown in FIG. 8, the second electrical conductor 88 is caused to have a higher voltage than the first electrical conductor 86, thereby inducing electrical current flow from the second electrical conductor 88 to the first electrical conductor 86 (direction of induced electrical current flow indicated by the right-to-left arrows shown in FIG. 8).

Further, based on an arrangement of magnets within a multiple magnet array, a magnetic field is also induced across the electrically non-conductive segment 82 shown in FIG. 8. For example, in FIG. 8, a magnetic field is induced across the electrically non-conductive segment 82 in a direction indicated by the up-pointing arrows shown in FIG. 8. Accordingly, a direction of electrically conductive fluid flowing through the electrically non-conductive segment 82, and consequently, through the corresponding magneto-hydrodynamic pipe 62, is dependent on a direction of the induced electrical current and a direction of the magnetic field. As shown in FIG. 8, the direction of the induced electrical current and the direction of the magnetic field causes fluid to flow into a plane of the sheet showing FIG. 8.

Further, the rate of fluid flow in a magneto-hydrodynamic pipe 62 may be controlled by adjusting a value of the electrical current induced across the fluid in the corresponding electrically non-conductive segment 82 of the magneto-hydrodynamic pipe 62. Further still, the rate of fluid flow in a magneto-hydrodynamic pipe 62 may be controlled by adjusting a strength or orientation of the magnetic field induced across the fluid in the corresponding electrically non-conductive segment 82 of the magneto-hydrodynamic pipe 62.

Figure 9:
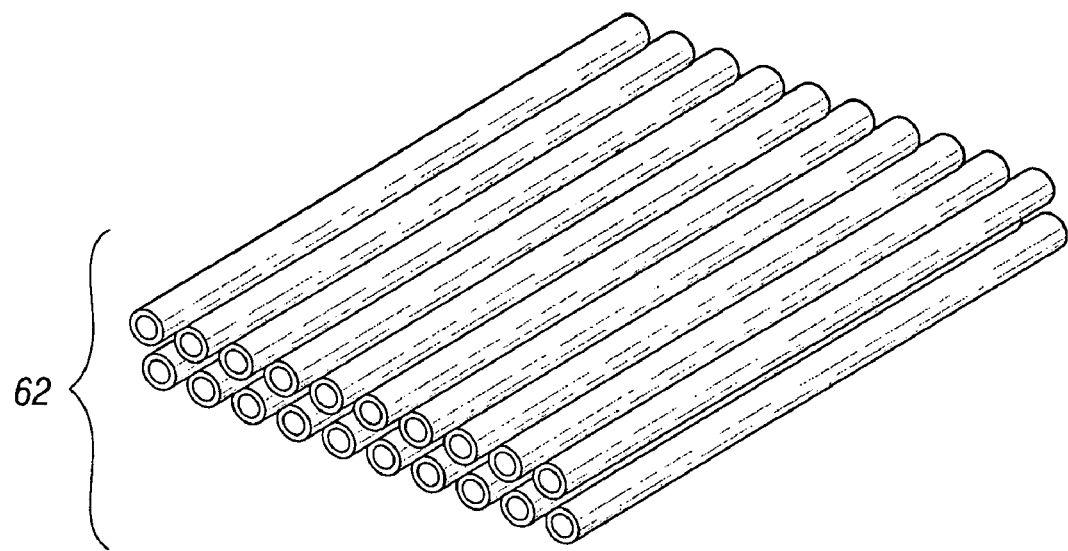
FIG. 9 shows a portion of a cooling apparatus in accordance with an embodiment of the present invention.

As described above, a multiple magnet array 60 may be used to direct fluid to and away from multiple integrated circuits. For each integrated circuit that may be cooled using the multiple magnet array 60, a set of magneto-hydrodynamic pipes 62 for carrying fluid toward the integrated circuit and a set of magneto-hydrodynamic pipes 62 for carrying fluid away from the integrated circuit are provided. An example of such sets of magneto-hydrodynamic pipes 62 is shown in FIG. 9.

Figure 10:
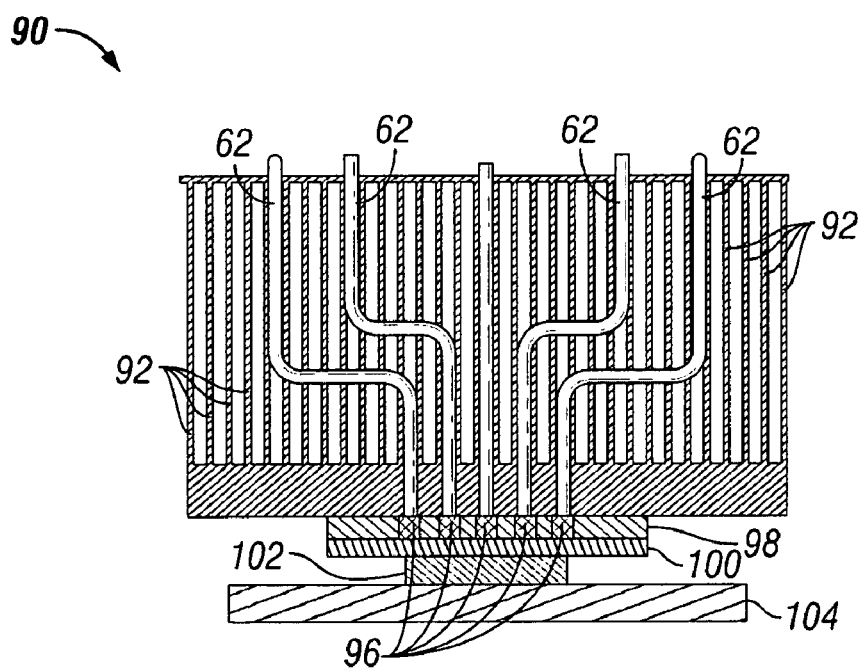
FIG. 10 shows a heat sink that may be used in accordance with an embodiment of the present invention.

The magneto-hydrodynamic pipes 62 operatively connected to the multiple magnet array 60 are each associated with a heat sink of an integrated circuit that may be cooled using the multiple magnet array 60. FIG. 10 shows an example of a heat sink 90 that may be used in accordance with an embodiment of the present invention. The heat sink 90 has a plurality of "fins" 92 allowing for and facilitating the dissipation of heat away from the heat sink 90. A plurality of magneto-hydrodynamic pipes 62 extend through the heat sink 90. Those skilled in the art will note that in one or more embodiments of the present invention, the magneto-hydrodynamic pipes 62 extending through the heat sink 90 may be integral with a body of the heat sink 90.

One end of each of the magneto-hydrodynamic pipes 62 is associated with a temperature sensor 96 embedded in a thermal interface material 98 disposed on a lid 100 positioned over an integrated circuit 102 and substrate 104. One another end of each of the magneto-hydrodynamic pipes 62 is operatively connected to a multiple magnet array 60 as described above.

Each temperature sensor 96 is configured to measure/sense a temperature at a particular location (or "hot spot") of the integrated circuit 102. Further, those skilled in the art will note that the sizing and arrangement of one or more of the temperature sensors 96, the thermal interface material 98, and the lid 100 may be adjusted so as to improve the accuracy of temperature measurements taken by one or more of the temperature sensors 96.

In one or more embodiments of the present invention, one or more of fins 92, magneto-hydrodynamic pipes 62, and lid 100 may be formed of a thermally conductive material. For example, one or more of fins 92, magneto-hydrodynamic pipes 62, and lid 100 may be formed of copper.

Further, in one or more embodiments of the present invention, a heat sink may have a different fin configuration than that shown in FIG. 10. Moreover, those skilled in the art will note that the heat sink 90 shown in FIG. 10 is not necessarily to scale and is not limited to a particular length, width, and/or height.

Further, although the heat sink 90 in FIG. 10 is shown as having a certain number of magneto-hydrodynamic pipes 62, in one or more other embodiments of the present invention, a different number of magneto-hydrodynamic pipes may be used.

As described above, a magneto-hydrodynamic pipe in a heat sink used with or as part of a cooling apparatus in accordance with one or more embodiments of the present invention has an end that is associated with a temperature sensor on a lid disposed over an integrated circuit. By using the temperature readings taken by the temperature sensor, a multiple magnet array of the cooling apparatus may be adjusted so as to effectuate a desired response with respect to cooling of a hot sport of a particular integrated circuit.

Figure 11:
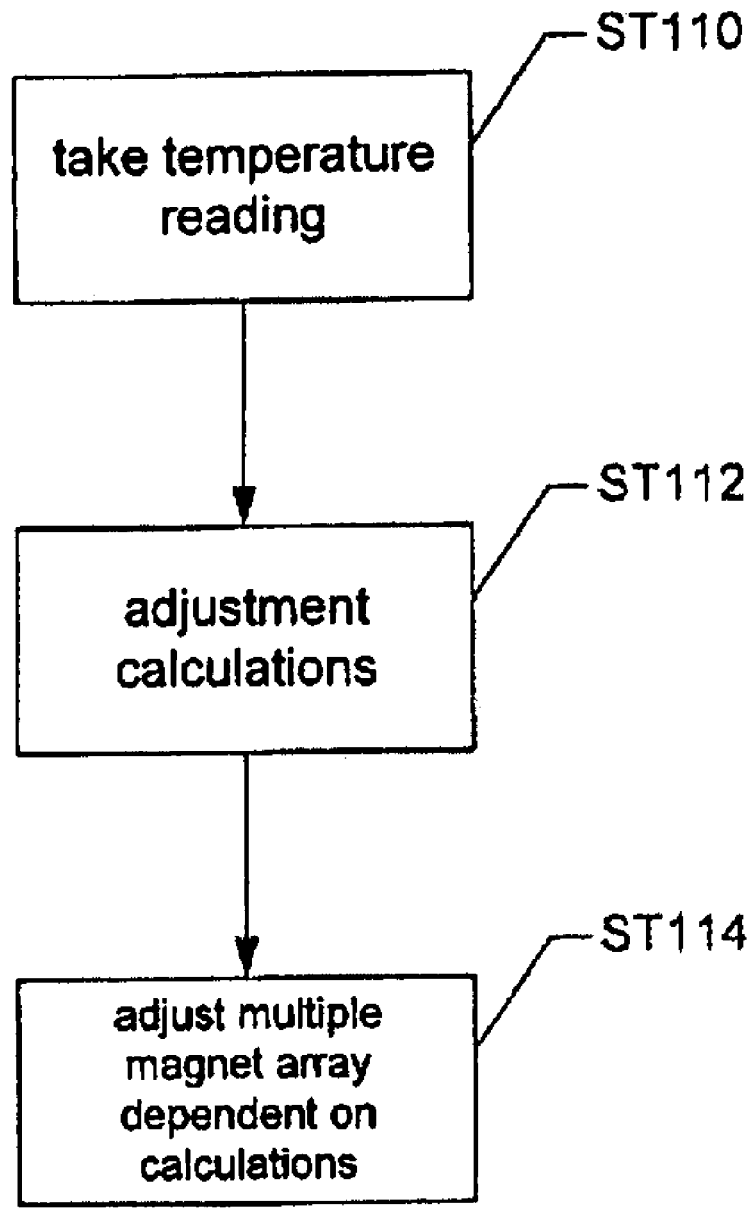
FIG. 11 shows a flow process in accordance with an embodiment of the present invention.

FIG. 11 shows an example of a flow process in accordance with an embodiment of the present invention. In FIG. 11, a temperature sensor is used to take a temperature reading at a location of an integrated circuit ST110. The temperature reading may be transmitted to, for example, a control module that calculates certain adjustments based on the temperature reading ST112. The adjustments may be made in reliance on assuming that ambient air flow conditions, cooling apparatus, and/or heat sink parameters remain constant. In such a manner, the parameters associated with a multiple magnet array of the heat sink may be adjusted without being dependent on varying ambient, heat sink, or cooling apparatus conditions.

In ST114, adjustments to the multiple magnet array of the heat sink are made based on the calculations in ST112. These adjustments may involve, for example, adjusting an electrical current induced across fluid in one or more segments in the multiple magnet array. In such a manner, the rate of fluid flow may be adjusted so as to more quickly or more slowly dissipate heat away from one or more hot spots.

Those skilled in the art will note that the control module may be any device or medium usable to make adjustment calculations. For example, the control module may be part of another integrated circuit or may be a software module executable by the integrated circuit being cooled. Further, in one or more embodiments of the present invention, a separate integrated circuit dedicated for controlling the parameters of the multiple magnet arrays may be implemented.

FIG. 12 shows a cylindrical heat sink 120 with circular heat sink fins 121 and a heat spreader 122. Conventional cylindrical heat sinks are cooled either by convection via circular heat sink fins alone or forced air cooling with a fan at the top of the heat sink. In one or more embodiments of the present invention, the heat spreader 122 contains electrically conductive liquid such as MHD fluid.

FIG. 13 depicts another view of a cylindrical heat sink with circular heat sink fins 131, a heat spreader 132, and a heat source contact 133. In one or more embodiments of the present invention, the heat source contact allows a plurality of heat sources to come to a direct contact with fluid inside the heat spreader 132. Protruding portions of heat sources, such as heat pipes with condensing ends, contact the fluid inside the heat spreader 132 for efficient cooling of heat sources.

Figure 14:
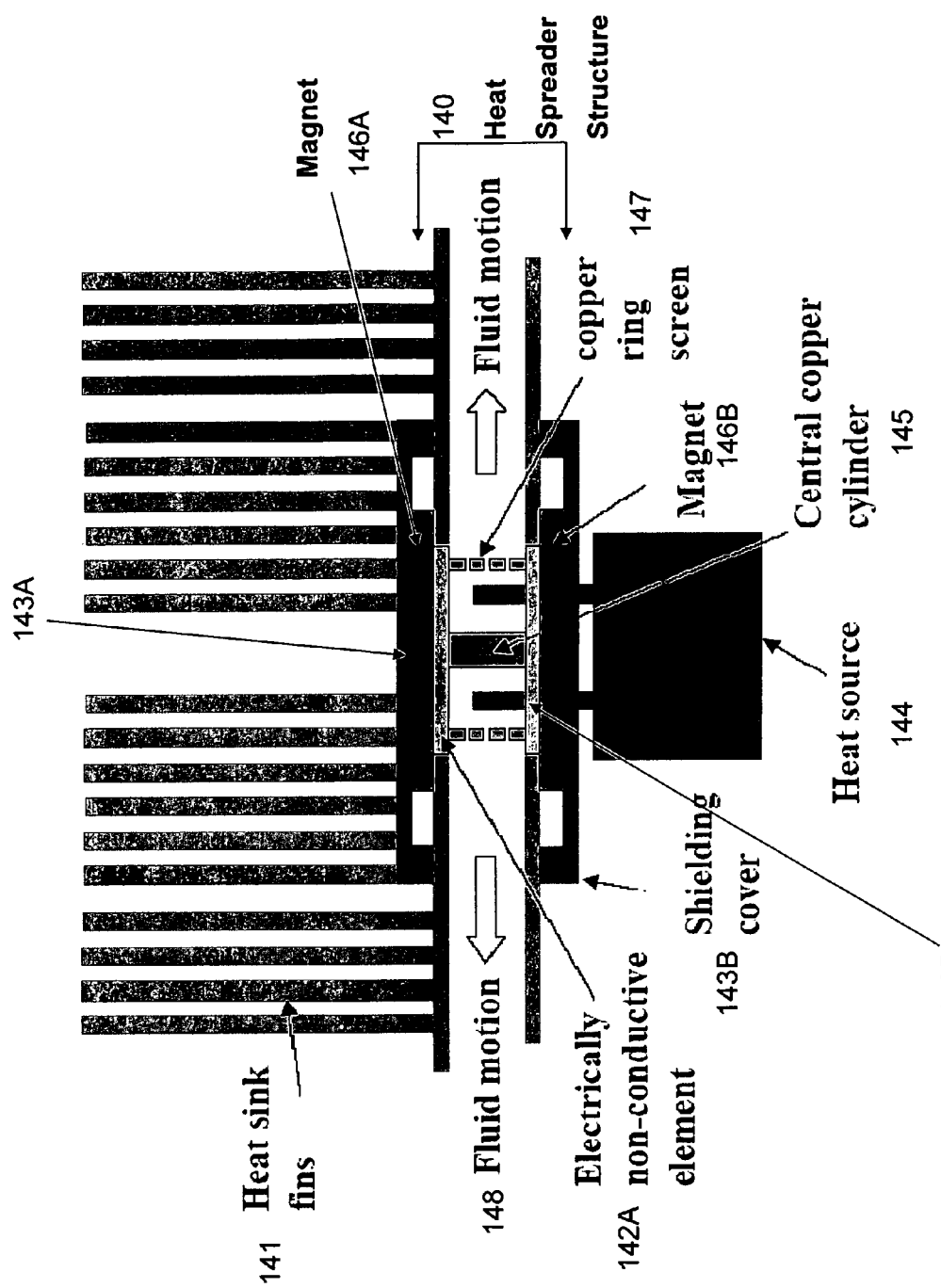
FIG. 14 shows a cross-sectional view of the cylindrical heat sink in accordance with an embodiment of the present invention.

FIG. 14 displays a cross-sectional view of the cylindrical heat sink described in FIG. 12 and FIG. 13. A heat spreader structure 140 has a central cylinder 145 encircled by a ring screen 147. Both the central cylinder 145 and the ring screen 147 are electrically conductive. In one or more embodiments of the present invention, the central cylinder 145 and the ring screen 147 are made of copper. The central cylinder 145 and the ring screen 147 are sandwiched by electrically non-conductive elements 142A and 142B.

In one or more embodiments of the present invention, the central cylinder 145 is positively charged and the ring screen 147 is negatively charged. A first magnet 146A is attached to the top electrically non-conductive element 142A and a second magnet 146B is attached to the bottom electrically non-conductive element 142B. A magnetic field is created by the first and the second magnets 146A and 146B through the electrically charged central cylinder 145 and the ring screen 147. The heat spreader structure 140 further contains electrically conductive, magneto-hydrodynamic (MHD) fluid 148 which experiences swirling and outward forces due to the presence of magnetic and electric potential. In one or more embodiments of the present invention, the protruding portions of the heat source 144 are inserted to the heat spread structure 140, providing direct contact with the MHD fluid 148. The electro-magnetically induced swirling motion of MHD fluid 148 provides rapid cooling to heat source 144.

This design provides a highly efficient heat spreader using magneto-hydrodynamic fluid transport mechanism. Outward and swirling motion of the MHD fluid 148 rapidly transports heat far away from the inserted portions of the heat source 144. Heat transfer rate is enhanced further by circular heat sink fins 141, which match the swirling, circular motion of the MHD fluid 148. Moreover, multiple heat sources can be inserted to the cylindrical heat spreader structure 140, resulting in a compact and thermally efficient design.

The heat spread structure 140 is shielded from magnetic forces by top and bottom shielding covers 143A and 143B. In one or more embodiments, the shielding covers are made of ferromagnetic materials such as iron, nickel, or cobalt. The circular heat sink fins are attached to the top shield 143A. A fan can be installed on top of the heat sink fins, hence further enhancing heat transfer rate.

Figure 15:
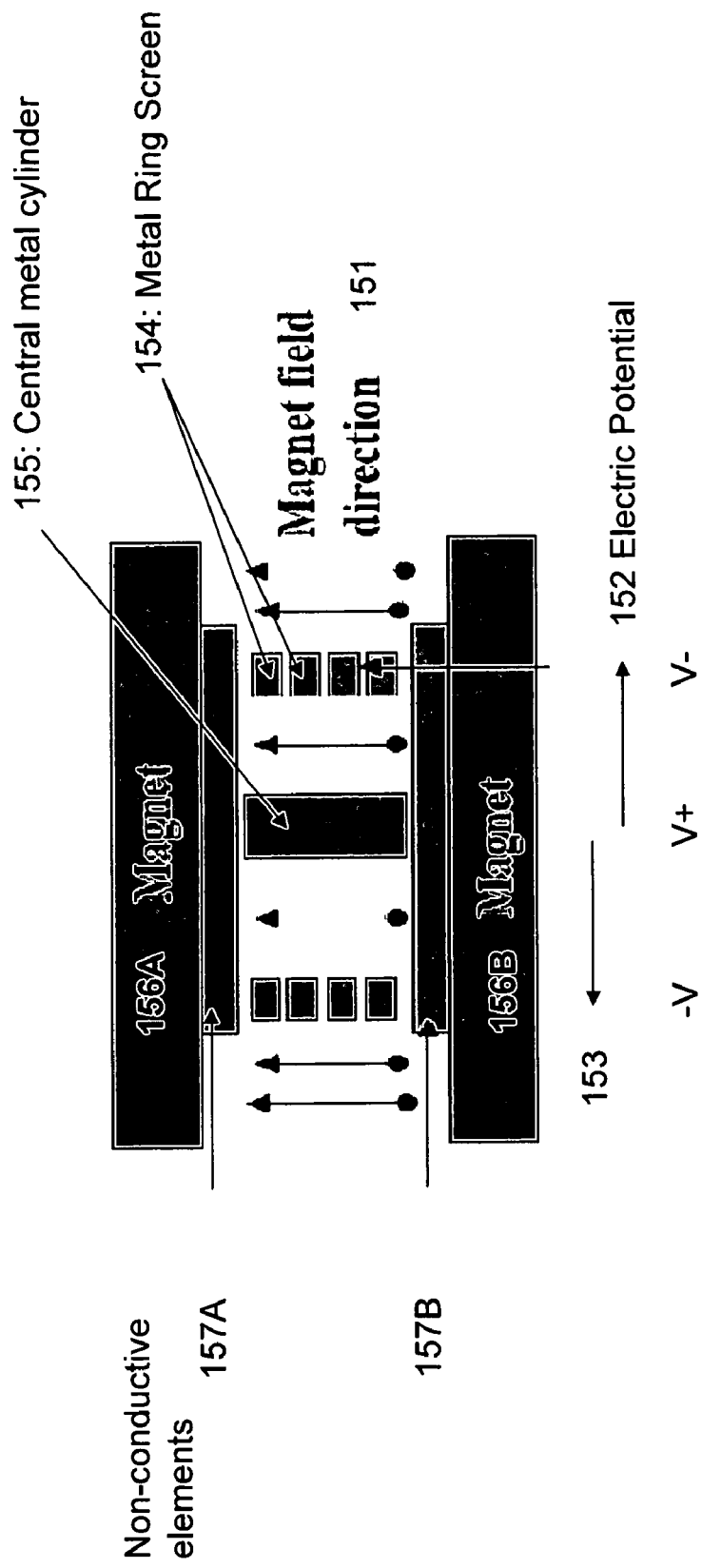
FIG. 15 shows a portion of a heat spreader near the bottom of the cylindrical heat sink with arrows indicating magnetic and electrical field directions in accordance with an embodiment of the present invention.

FIG. 15 shows a portion of the cross section of the MHD heat spreader structure. In this particular embodiment of the present invention, upward magnetic fields are generated by top and bottom magnets 156A and 156B. A central metal cylinder 155 is positively charged and a metal ring screen 154 is negatively charged, creating E-field pointing radially outward. The metal ring screen is electrically insulated by non-conductive elements 157A and 157B. In one or more embodiments of the present invention the metal ring screen 154 and the central metal cylinder 155 are copper.

Figure 16:
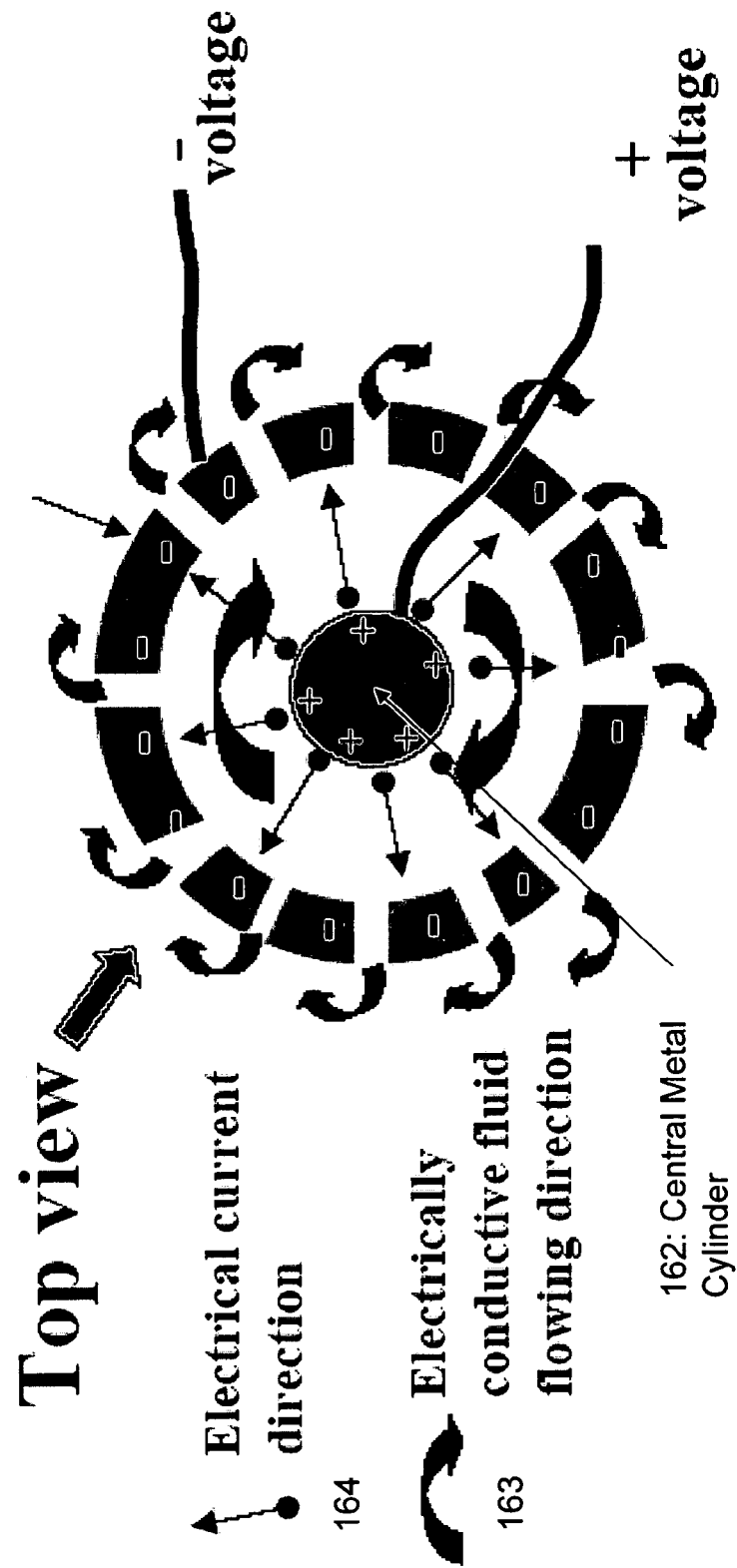
FIG. 16 shows a top view of a portion of the heat spreader from the cylindrical heat sink with arrows indicating electrical current and electrically conductive fluid flowing direction in accordance with an embodiment of the present invention.

FIG. 16 portrays a top view of a portion of the MHD heat spreader structure. A positively charged central metal cylinder 162 and a negatively charged metal ring screen 161 create electrical field 164 pointing radially outward. The presence of magnetic field pointing into the page induces electrically conductive MHD fluid 163 to exhibit outwardly swirling motion as depicted in the figure. The radially outward and swirling motion of the MHD fluid 163 greatly enhances thermal transfer rate. The heat sink spreader structure acts as a cylindrical MHD pump to drive forced convectional flow of the MHD fluid 163. The outwardly swirling motion of the MHD fluid 163 induced by magnetic and electric potential provides provide high flow rate of the MHD fluid 163 and hence a high rate of cooling.

Figure 17:
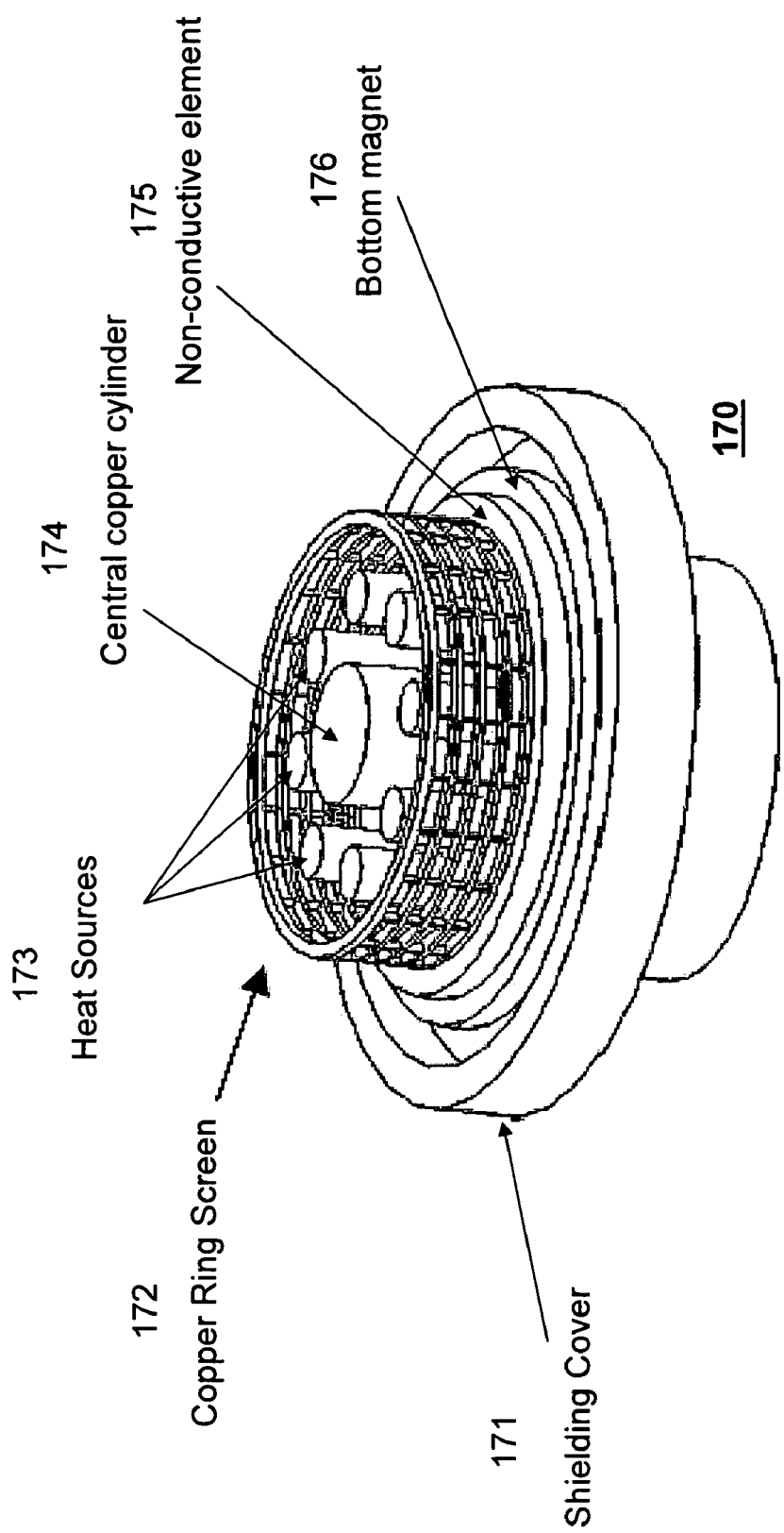
FIG. 17 shows a portion of the heat spreader from the cylindrical heat sink with heat sources contacting the heat spreader in accordance with an embodiment of the present invention.

FIG. 17 shows another view of a portion of a cylindrical heat spreader 170 containing MHD fluid. A plurality of heat sources 173 is inserted to the cylindrical heat spreader 170. In one or more embodiments of the present invention, a central copper cylinder is positively charged and a copper ring screen is negatively charged, creating an electric field pointing radially outward. FIG. 17 also portrays a non-conductive element 175 underneath the copper ring screen and a bottom magnet 176 underneath the non-conductive element 175. A ferroelectric shielding cover 171 provides magnetic shielding to the cylindrical heat spreader 170.

Advantages of the present invention may include one or more of the following. In one or more embodiments of the present invention, a cooling apparatus may be used to cool one or more integrated circuits disposed on a circuit board.

In one or more embodiments of the present invention, a flow of thermally conductive fluid used to cool one or more hot spots of an integrated circuit may be controlled so as to effectuate a desired level of cooling.

In one or more embodiments of the present invention, a multiple magnet array for driving the flow of fluid used to cool one or more hot spots of an integrated circuit resides separate from the integrated circuit.

In one or more embodiments of the present invention, a multiple magnet array may be used to have multiple channels cool across an area of an integrated circuit, where the multiple magnet array may also be used to more directly cool a hot spot of an integrated circuit.

In one or more embodiments of the present invention, a magnetic field used to drive the flow of fluid used to cool one or more hot spots of an integrated circuit may be shielded so as to prevent magnetic field interference.

In one or more embodiments of the present invention, a cylindrical heat spreader containing MHD fluid with swirling induced by electric and magnetic fields may be used to cool one or more heat sources.

In one or more embodiments of the present invention, a cylindrical heat spreader containing MHD fluid with swirling induced by electric and magnetic fields may function as an MHD pump to force convective flow of fluid from hot region to colder regions for highly efficient cooling.

In one or more embodiments of the present invention, a cylindrical heat spreader containing MHD fluid with swirling induced by electric and magnetic fields may have circular heat sink fins which resemble circular motion of the swirling, greatly increasing the rate of heat transfer.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A heat spreader for dissipating heat from a heat source comprising:
   a central metallic cylinder;
   a perforated metal ring screen surrounding the central metallic cylinder; and
   a magneto-hydrodynamic fluid inside the heat spreader, wherein electrical and magnetic fields applied to the heat spreader create a swirling motion in the magneto-hydrodynamic fluid.

2. The heat spreader according to claim 1, further comprising a first electrically non-conductive element attached to a top portion of the central metallic cylinder, and a second electrically non-conductive element attached to a bottom portion of the central metallic cylinder.

3. The heat spreader according to claim 2, further comprising a first magnet attached to the first electrically non-conductive element and a second magnet attached to the second electrically non-conductive element.

4. The heat spreader according to claim 3, further comprising a first magnetic leakage prevention shield covering the first magnet and a second magnetic leakage prevention shield covering the second magnet.

5. The heat spreader according to claim 1, wherein the heat sink spreader has a cylindrical shape.

6. The heat spreader according to claim 3, wherein the central metallic cylinder is positively charged and the metal ring screen is negatively charged.

7. The heat spreader according to claim 6, wherein the magneto-hydrodynamic fluid inside the heat spreader is subject to swirling motion due to magnetic fields provided by the first and the second magnets and electric potential provided by the positively charged central metallic cylinder and the negatively charged metal ring screen.

8. The heat spreader according to claim 4, further comprising circular heat sink fins attached to a top of the first shield covering.

9. The heat spreader according to claim 1, wherein the central metallic cylinder and the perforated metal ring screen surrounding the central metallic cylinder are made of copper.

10. The heat spreader according to claim 1, further comprising a magneto-hydrodynamic pump for controlling the flow rate of the magneto-hydrodynamic fluid inside the heat sink spreader.

11. A method for cooling a heat source with a heat spreader comprising a central metallic cylinder surrounded by a perforated metallic ring screen and a magneto-hydrodynamic fluid, the method comprising:
   electrically charging the central metallic cylinder and oppositely electrically charging the perforated metallic ring screen to create an electric potential between the central metallic cylinder and the perforated metallic ring screen;
   creating a magnetic field inside the heat spreader; and
   providing magneto-hydrodynamic fluid inside the heat spreader; and
   swirling the magneto-hydrodynamic fluid to cool a heat source, wherein the
   swirling motion is induced by the electric potential and the magnetic fields.

12. The method according to claim 11, further comprising inserting a heat source to the heat spreader and establishing contact between the magneto-hydrodynamic fluid and the heat source.

13. The method according to claim 11, wherein the swirling of swirling the magneto-hydrodynamic fluid is induced in an inside-to-outside direction.

14. The method according to claim 11, wherein the swirling of the magneto-hydrodynamic fluid further comprises attaching circular heat sink fins on top of the heat spreader.

15. The method according to claim 11, wherein the electrical charging of the central metallic cylinder and the perforated metallic ring screen comprises positively charging the central metallic cylinder and negatively charging the metallic ring screen.

16. A cylindrical heat spreader comprising:
   a central copper cylinder surrounded by a perforated copper ring screen, wherein the central copper cylinder is electrically charged and the copper ring screen is oppositely electrically charged so that an electric potential is create between the central copper cylinder and the perforated copper ring screen;
   electrically insulating materials sandwiching the central copper cylinder and the perforated copper ring screen;
   a top magnet and a bottom magnet sandwiching the electrically insulating materials;
   a top shield covering the top magnet;
   a bottom shield covering the bottom magnet; and
   magneto-hydrodynamic fluid inside the cylindrical heat spreader.

17. The cylindrical heat spreader according to claim 16, further comprising circular heat sink fins attached to the top surface of the cylindrical heat spreader.

18. The cylindrical heat spreader according to claim 16, wherein the top shield and the bottom shield are made of ferromagnetic materials such as iron, nickel, and cobalt.

19. The cylindrical heat spreader according to claim 16, wherein the magneto-hydrodynamic fluid experiences swirling and outward motion due to magnetic fields generated from the top to the bottom magnets and electric potential between the central copper cylinder and the perforated copper ring screen.

20. The cylindrical heat spreader according to claim 16, further comprising a plurality of protruding portions of heat sources contacting the magneto hydrodynamic fluid inside the cylindrical heat spreader.

* * * * *

UNITED STATES PATENT AND TRADEMARK OFFICE
CERTIFICATE OF CORRECTION

| | | |
|---|---|---|
| PATENT NO. | : 7,628,198 B2 | Page 1 of 1 |
| APPLICATION NO. | : 11/346014 | |
| DATED | : December 8, 2009 | |
| INVENTOR(S) | : Chien Ouyang | |

It is certified that error appears in the above-identified patent and that said Letters Patent is hereby corrected as shown below:

In Claim 7, Column 9 (line 37), "negatively charged metal ring screen" should read --negatively charged <u>perforated</u> metal ring screen--;

In Claim 11, Column 10 (line 5), please delete the space after the word --the--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,628,198 B2
APPLICATION NO. : 11/346014
DATED : December 8, 2009
INVENTOR(S) : Chien Ouyang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 981 days.

Signed and Sealed this

Second Day of November, 2010

David J. Kappos
*Director of the United States Patent and Trademark Office*